United States Patent
Ermes et al.

(10) Patent No.: US 11,841,412 B2
(45) Date of Patent: Dec. 12, 2023

(54) CALCULATION OF A B0 IMAGE MULTIPLE DIFFUSION WEIGHTED MR IMAGES

(71) Applicant: KONINKLIJKE PHILIPS N.V., Eindhoven (NL)

(72) Inventors: Pierre Ermes, Son en Breugel (NL); Giuseppe Valvano, Best (NL)

(73) Assignee: Koninklijke Philips N.V., Eindhoven (NL)

(*) Notice: Subject to any disclaimer, the term of this patent is extended or adjusted under 35 U.S.C. 154(b) by 146 days.

(21) Appl. No.: 17/432,924

(22) PCT Filed: Feb. 18, 2020

(86) PCT No.: PCT/EP2020/054158
§ 371 (c)(1),
(2) Date: Aug. 21, 2021

(87) PCT Pub. No.: WO2020/173748
PCT Pub. Date: Sep. 3, 2020

(65) Prior Publication Data
US 2022/0187404 A1 Jun. 16, 2022

(30) Foreign Application Priority Data
Feb. 25, 2019 (EP) .................... 19159092

(51) Int. Cl.
*G01V 3/00* (2006.01)
*G01R 33/563* (2006.01)
(Continued)

(52) U.S. Cl.
CPC ..... *G01R 33/56341* (2013.01); *G01R 33/543* (2013.01); *G01R 33/5616* (2013.01); *G01R 33/56509* (2013.01); *G01R 33/56572* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 6,163,152 A   12/2000 Bernestein et al.
9,851,426 B2  12/2017 Chenevert et al.
(Continued)

FOREIGN PATENT DOCUMENTS

DE   102009039772 A1 * 3/2011
JP       6002970 B2 * 10/2016
(Continued)

OTHER PUBLICATIONS

Tan et al "Effects of Gradient Nonlinearity, Its Correction Methods and Distortion On Diffusion Weighted Imaging" Proc. Intl. Soc. Mag. Reson. Med 20 (2012) p. 258.
(Continued)

*Primary Examiner* — Walter L Lindsay, Jr.
*Assistant Examiner* — Frederick Wenderoth

(57) ABSTRACT

The invention provides for a medical imaging system (100, 300). The execution of the machine executable instructions (110) causes a processor (102) to: receive (200) multiple diffusion weighted images (112) of a subject (318), wherein the multiple diffusion weighted images each have an assigned b-value, wherein the multiple diffusion weighted images each have an assigned diffusion weighting direction, wherein for a region of interest (309) there is at least one corresponding voxel (506) in each of the multiple diffusion weighted images; construct (202) a set of equations (114) for each of the at least one corresponding voxel, wherein the set of equations is constructed from an apparent diffusion equation for the assigned diffusion weighting direction of each of the multiple diffusion weighted images; solve (204)
(Continued)

the set of equations for each voxel for the $b_0$ value as an optimization; and construct (206) a $b_0$ image using the $b_0$ value for each voxel.

20 Claims, 5 Drawing Sheets

(51) Int. Cl.
    *G01R 33/54*     (2006.01)
    *G01R 33/561*    (2006.01)
    *G01R 33/565*    (2006.01)

(58) Field of Classification Search
    USPC .......................................................... 324/309
    See application file for complete search history.

(56) References Cited

U.S. PATENT DOCUMENTS

| | | | |
|---|---|---|---|
| 2013/0285653 A1* | 10/2013 | Zhou | G01R 33/56341 324/318 |
| 2014/0312897 A1 | 10/2014 | Tan et al. | |
| 2015/0022210 A1 | 1/2015 | Yokosawa et al. | |
| 2015/0137813 A1* | 5/2015 | Chenevert | G01R 33/56341 |
| 2015/0160322 A1 | 6/2015 | Matthews | |
| 2016/0084929 A1 | 3/2016 | Dale et al. | |
| 2016/0139226 A1* | 5/2016 | Manikis | G06F 17/10 703/2 |
| 2018/0348325 A1 | 12/2018 | Feiweier et al. | |
| 2018/0356486 A1 | 12/2018 | Yang et al. | |

FOREIGN PATENT DOCUMENTS

WO    WO-2013166416 A1 * 11/2013
WO    2017221654 A1    12/2017

OTHER PUBLICATIONS

Nickey et al "Quantitative Diffusion Weighted Imaging for Differentiation of Benign and Malignant Breast Lesions: The Influence of the Choice of B-Values" Journal of Magnetic Resonance Imaging, vol. 31 p. 1100-1105 (2010).

Malyarenko et al "Analysis and Correction of Gradient Nonlinearity Bias in Apparent Diffusion Coefficient Measurements" Magnetic Resonance in Med. 71 p. 1312-1323 (2014).

Lee Dong Hoon et al "Minimisation of Signal Intensity Differences in Distortion Correction Approaches of Brain Magnetic Resonance Diffusion Tensor Imaging" European Radiology, vol. 28, No. 10 Apr. 12, 2018 p. 4314-4323.

Irfanoglu Okan et al "DR_BUDDI: Diffeomorphic Resistration for Blip Up-Down Diffusion Imaging" International Conf. of Computer Analysis . . . p. 218-226 Sep. 14, 2014.

Park et al "Comparison of the Diagnostic Performance of Synthetic Versus Acquired High b-Value . . . " J. Magn. Reson. Imaging 2018.

Malyarenko et al "Practical Estimate of Gradient Nonlinearity for Implementation of ADC Bias Correction" J. Magn. Reson Imaging 40(6) p. 1487-1495 Dec. 2014.

Xi et al "Low-to-High b Value DWI Ratio Approaches in Multiparametric MRI of the Prostate . . . " Quant Imaging Med Surg 2018;8(6):557-567.

International Search Report and Written Opinion from PCT/EP2020/054158 dated Sep. 3, 2020.

* cited by examiner

CALCULATION OF A B0 IMAGE MULTIPLE DIFFUSION WEIGHTED MR IMAGES

CROSS REFERENCE TO RELATED APPLICATIONS

This application is a U.S. national phase application of International Application No. PCT/EP2020/054158 filed on Feb. 18, 2020, which claims the benefit of EP Application Serial No. 19159092.6 filed on Feb. 25, 2019 and is incorporated herein by reference.

FIELD OF THE INVENTION

The invention relates to magnetic resonance imaging, in particular to diffusion weighted imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the $B_0$ field or the main magnetic field. Gradient magnetic fields and magnetic fields (the $B_1$ field) caused by radio frequency (RF) pulses may be used to manipulate the orientation of spins. If the $B_1$ field rotates spins out of alignment with the B0 field they will begin to process and generate a radio frequency signal.

In Diffusion Weighted Imaging (DWI) after spins have been rotated to an angle with respect to the $B_0$ field a first diffusion weighted gradient is used to dephase spins within a volume. A second identical diffusion weighted gradient then rephases the spins within the volume. After the spins are rephased, their radio frequency signal can be measured. If spins move in or out of the volume, they will not be correctly rephased. The intensity of a diffusion weighted image is therefore very sensitive to the diffusion of spins.

The dephasing and rephasing of the diffusion weighted gradients depend upon the magnitude of the gradient the duration of the gradient and the time separation between the two diffusion weighted gradients. A measure which takes these factors into account is the b-value. If the b-value is equal to zero then the diffusion weighted gradients are not used. When the b-value is zero it is referred to as $b_0$. A $b_0$ image is a diffusion weighted image with the diffusion weighted gradients turned off or not used. That is, the $b_0$ image is a magnetic resonance image without diffusion encoding, i.e. the underlying magnetic resonance signals are not diffusion sensitive. The $b_0$-values correspond to voxel/pixel values when no diffusion weighting is applied. In other words, the $b_0$-value is the image intensity at no diffusion weighting. In the journal article Malyarenko et al., "Analysis and correction of Gradient Nonlinearity Bias in Apparent Diffusion Coefficient Measurements," Magnetic Resonance in Medicine 71:1312-1323 (2014) a method of correcting for gradient nonlinearity bias in ADC measurements is disclosed. The disclosed method relies on having a $b_0$ image.

In United States Patent publication U.S. Pat. No. 9,851,426 B2, by the same authors as the Malyarenko et al paper, techniques for correcting gradient non-linearity bias in mean diffusivity measurements by MRI systems are shown and include a minimal number of spatial correction terms to achieve sufficient error control using three orthogonal diffusion weighted imaging (DWI) gradients. The correction is based on rotation of system gradient nonlinearity tensor into a DWI gradient frame where spatial bias of b-matrix is described by its Euclidian norm. The techniques obviate time consuming multi-direction acquisition and noise-sensitive mathematical diagonalization of a full diffusion tensor for medium of arbitrary anisotropy.

SUMMARY OF THE INVENTION

The invention provides for a medical imaging system, a computer program product, and a method in the independent claims. Embodiments are given in the dependent claims.

In the journal article Malyarenko et al. a method for correcting for the gradient nonlinearity is disclosed. However, this method requires a knowledge of $b_0$ image to make this correction. One can of course measure the $b_0$ image directly, however noise in the $b_0$ image reduces the accuracy of the gradient nonlinearity correction. Examples may further provide for a better gradient nonlinearity correction by calculating the $b_0$ image using an optimization process.

This may be accomplished using a number or collection of diffusion weighted images which are acquired for different b-values and possibly with the diffusion weighted gradients pointed in different directions. A set of equations for each voxel may then be constructed using the apparent diffusion equation. Once the set of equations is constructed it can be solved using an optimization process for the $b_0$ value for that voxel. The more diffusion weighted images that are used, the more accurate the $b_0$ value is. An insight of the invention is that by calculating the $b_0$ image using an optimization process sensitivity to noise In the $b_0$ image is less than in a directly measured $b_0$ image. A measured $b_0$ image can also be used in the optimization to improve the calculated $b_0$ image.

In one aspect the invention provides for a medical imaging system that comprises a memory for storing machine-executable instructions. The medical imaging system further comprises a processor for controlling the medical imaging system. Execution of the machine-executable instructions causes the processor to receive multiple diffusion weighted images of a subject. The multiple diffusion weighted images each have an assigned b-value. The multiple diffusion weighted images each have an assigned diffusion weighting direction. For a region of interest there is at least one corresponding voxel in each of the multiple diffusion weighted images.

As mentioned above, in diffusion weighted imaging spins are first rotated to an angle where they process and then a diffusion weighted gradient is applied in a diffusion weighting direction. This de-phases the spins. After a period of time the diffusion weighted gradient is applied again and this is used to re-phase the spins. Spins which have left this volume or which have entered the volume are not correctly re-phased. Essentially the drop in intensity is able to indicate the amount of diffusion out of a volume. The effectiveness of the diffusion weighting gradient is the above-mentioned b-value. The amount of de-phasing depends upon the amplitude and time of the gradient.

The multiple diffusion weighted images were acquired using a magnetic resonance imaging system and the b-value is the b-value for the diffusion weighting gradients that were used during the acquisition. The direction that the gradient was applied is in the diffusion weighting direction. Typically, when performing diffusion weighted imaging there are three orthogonal diffusion weighted directions that are chosen for a variety of different b-values. Although mathematically convenient the diffusion weighting directions do not need to be orthogonal or even be aligned with the coordinates system of the magnetic resonance imaging system. The b-value when there is no gradient used is the so-called b0 value.

Execution of the machine-executable instructions further cause the processor to construct a set of equations for each of the at least one corresponding voxel. By a corresponding voxel this means that there is a voxel in each of the images that is equivalent to the other voxels. Ideally the subject would be stationary and there would be a series of images and there is a one-to-one correspondence to each of the voxels. The set of equations is constructed from an apparent diffusion equation for the assigned diffusion weighting direction of each of the multiple weighted images. An apparent diffusion equation as used herein is an equation which may be used for calculating apparent diffusion equation coefficients.

The apparent diffusion equation for a single voxel is:

$$S(b^k) = S_0 e^{-\|b^k\| ADC^k}, \quad (1)$$

Where $S(b^k)$ is the image intensity following diffusion gradient $b^k$, and $S_0$ is the non-diffused image intensity. $ADC^k$ is the apparent diffusion coefficient in the direction of the diffusion gradient $b^k$. The value $S_0$ is the $b_0$ value. For every diffusion weighted image of the multiple diffusion weighted images there is one equation (1) which can be added to set of equations. The $S(b^k)$ are the measured values. Using an optimization, one can then solve for the $b_0$ value as well as the ADC values. Equation 1 can be formulated in different ways. For example, the $b^k$ and the $ADC^k$ values can be vector quantities and the dot product of the two vectors is taken in Eq. (1).

The set of equations can be formulated in different ways that are mathematically equivalent. For example, the above apparent diffusion equation can be rewritten as a linear equation by taking the logarithm. This may for example make the calculations more straight forward and easy but even if the Eq. (1) is in the form as written above it can still be solved.

Execution of the machine-executable instructions further cause the processor to solve the set of equations for each voxel for the $b_0$ value as an optimization. In particular there may be noise in the voxels due to inherent measurements or possibly also small amounts of movements or other imperfections in the multiple diffusion weighted images. By solving the said equations as an optimization for the $b_0$ value a $b_0$ value can be obtained which has less noise than if the $b_0$ value was measured directly. It should also be noted that one of the assigned b-values can be zero such that the $b_0$ values are directly measured. The use of the optimization may enable this measured $b_0$ image to be further corrected using the other acquired multiple diffusion weighted images.

In another embodiment execution of the machine-executable instructions further causes the processor to construct a $b_0$ image using the $b_0$ value for each voxel. The $b_0$ image may be useful for several different things. For example, it may be useful in correcting for a gradient non-linearity. The $b_0$ image can also be compared to other multiple diffusion weighted images for various b-values for making quantitative estimates of the diffusion.

In another embodiment execution of the machine-executable instructions further cause the processor to calculate an image intensity correction of at least one of the multiple diffusion weighted images using the $b_0$ image to correct for a gradient non-linearity. Once the $b_0$ image is calculated, the method described in Malyarenko et. al. can be used.

In another embodiment the image intensity correction is calculated in each assigned diffusion weighting direction. This may be beneficial because it may provide for better correction of the diffusion weighted images.

In another aspect the medical imaging system further comprises a magnetic resonance imaging system. The memory further contains pulse sequence commands configured for controlling the magnetic resonance imaging system to acquire magnetic resonance imaging data according to a diffusion weighted magnetic resonance imaging protocol.

Execution of the machine-executable instructions further cause the processor to control the magnetic resonance imaging system to acquire the magnetic resonance imaging data. Execution of the machine-executable instructions further cause the processor to reconstruct the multiple diffusion weighted images using the magnetic resonance imaging data.

After the multiple diffusion weighted images are reconstructed the b-value and the diffusion weighting direction may both be assigned to a particular diffusion weighted image.

In another embodiment execution of the machine-executable instructions further cause the processor to perform a motion correction between the multiple diffusion weighted images before constructing the set of equations. If the subject moved in between the acquisition of the different multiple diffusion weighted images then the voxels may be displaced. The standard image correction methods could be used to correct this. For example, there may be an image registration between the various multiple diffusion weighted images to correct for motion.

In another embodiment the multiple diffusion weighted images are EPI multiple diffusion weighted images. Execution of the machine-executable instructions further causes the processor to perform an EPI distortion correction on the multiple diffusion weighted images before constructing the set of equations. Very commonly diffusion weighted images are acquired using EPI or echo-planar imaging. B0 inhomogeneities may cause spatial non-linear image distortions in EPI images. For example, a deformable registration may be used to correct for EPI distortion.

In another embodiment each of the set of equations is constructed by setting a logarithm of the measured intensity of a voxel equal to $b_0$ plus the b-value terms times (or dot product) an apparent diffusion coefficient terms for each diffusion direction. This can for example be derived by taking the logarithm of Eq. 1:

$$\ln(S(b_i^k)) = b_0 + b_i^k \cdot ADC^k \quad (2)$$

The super script k represents the direction of the diffusion weighted gradient and i represents the ith b-value. In this equation there is only one b-value term and one apparent diffusion coefficient term. There could be more terms, if for example the coordinate system is not aligned with the direction of the diffusion weighted gradient.

In another embodiment the optimization is solved as an exponential fit over the b-values in each of the set of equations.

In another embodiment the b-value for one of the multiple diffusion weighted images is zero. As is mentioned previously, it is possible to measure the $b_0$ image. However, the $b_0$ image may be noisy. If the b-value for one of the multiple diffusion weighted images is zero then the optimization may provide for a means of improving the quality, for example losing the signal-to-noise.

In another embodiment execution of the machine-executable instructions further causes the processor to calculate apparent diffusion coefficients for each voxel during solution of the set of equations for each voxel for the $b_0$ value. This embodiment may be beneficial because the optimization may be used not only to calculate the $b_0$ value but also to calculate the apparent diffusion coefficients. The optimization that is used to solve the set of equations formed using Eq. 1 can also be used to solve for the ADC values at the same time.

In another embodiment execution of the machine-executable instructions further causes the processor to calculate corrected apparent diffusion coefficients using the $b_0$ image. The method described in the Malyarenko et. al. paper may be used (cf. Eq. 6 in Malyarenko).

In another aspect the invention provides for a method of medical imaging. The method comprises receiving multiple diffusion weighted images of a subject. The multiple diffusion weighted images each have an assigned b-value. The multiple diffusion weighted images each have an assigned defined diffusion weighting direction. For a region of interest there is at least one corresponding voxel in each of the multiple diffusion weighted images. The method further comprises constructing a set of equations for each of the at least one corresponding voxel. The set of equations is constructed from an apparent diffusion equation for the assigned diffusion weighting direction of each of the multiple diffusion weighted images. The method further comprises solving the set of equations for each voxel for the b0 value as an optimization end. The method further comprises constructing a b0 image using the b0 value for each voxel.

In another embodiment the method further comprises calculating an image intensity correction of at least one of the multiple diffusion weighted images using the $b_0$ image to correct for gradient non-linearity.

In another aspect the invention provides for a computer program product comprising machine-executable instructions for execution by a processor controlling a medical imaging system. Execution of the machine-executable instructions causes the processor to receive multiple diffusion weighted images of a subject. The multiple diffusion weighted images each have an assigned b-value. The multiple diffusion weighted images each have an assigned diffusion weighting direction.

For a region of interest there is at least one corresponding voxel in each of the multiple diffusion weighted images. Execution of the machine-executable instructions further cause the processor to construct a set of equations for each of the at least one corresponding voxel. The set of equations is constructed from an apparent diffusion equation for the assigned diffusion weighting direction if each of the multiple diffusion weighted images. Execution of the machine-executable instructions further cause the processor to solve the set of equations for each voxel for the $b_0$ value as an optimization. Execution of the machine-executable instructions further cause the processor to construct a $b_0$ image using the $b_0$ value for each voxel.

In another embodiment the medical imaging system further comprises a magnetic resonance imaging system. Execution of the machine-executable instructions further causes the processor to control the magnetic resonance imaging system with pulse sequence commands to acquire magnetic resonance imaging data. The pulse sequence commands are configured to control the magnetic resonance imaging system to acquire magnetic resonance imaging data according to a diffusion weighted magnetic resonance imaging protocol. Execution of the machine-executable instructions further causes the processor to reconstruct the multiple diffusion weighted images using the magnetic resonance imaging data.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, $B_1$-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance imaging (MRI) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image or MR image is defined herein as being the reconstructed two or three dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
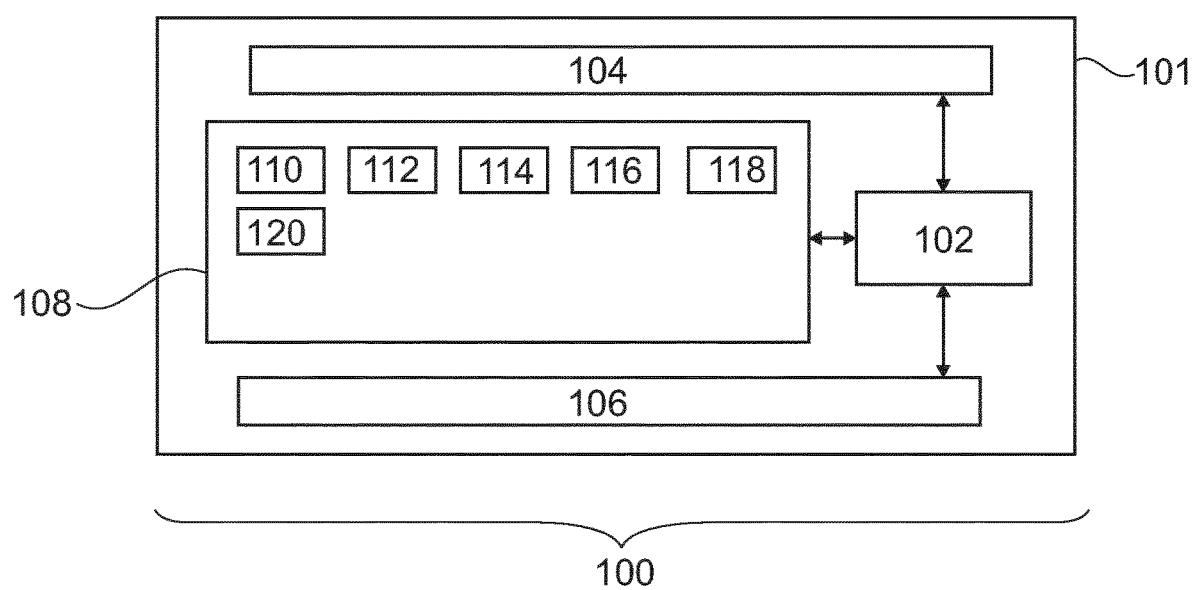
FIG. 1 illustrates an example of a medical imaging system.

FIG. 1 illustrates an example of a medical imaging system 100. In the example in FIG. 1 the medical imaging system is a workstation for image processing. The medical imaging system 100 is shown as comprising a computer 101. The computer 101 comprises a processor 102. The processor 102 is intended to represent one or more processors and may also represent processors distributed to multiple computer systems. The processor 102 is shown as being connected to an optional hardware interface 104. The hardware interface 104 may for example enable the processor 102 to control other components of the medical imaging system 100 and may also be a network interface. The processor 102 is shown as being further connected to a user interface 106.

The user interface 106 may for example be used for displaying information and/or receiving commands from an operator. The processor 102 is shown as being further connected to a memory 108. The memory 108 may be any combination of memory which is accessible to the processor 102. This may include such things as main memory, cached memory, and also non-volatile memory such as flash RAM, hard drives, or other storage devices. In some examples the memory 108 may be considered to be a non-transitory computer-readable medium.

The memory 108 is shown as containing machine-executable instructions 110. The machine-executable instructions 110 enable the processor 102 to control the various operation and function of the medical imaging system 100 as well as perform various data and image manipulation tasks.

The memory 108 is shown as further containing multiple diffusion weighted images 112. They may for example have been received via a network or other storage medium. The memory 108 is further shown as containing a set of equations 114. The set of equations were constructed from an apparent diffusion equation using the multiple diffusion weighted images 112. The memory 108 is further shown as containing a $b_0$ image 116 that was constructed by solving the set of equations 114 using an optimization. The optimization may for example be programmed into the machine-executable instructions 110.

The memory 108 is shown as containing an optional apparent diffusion coefficients. When the set of equations 114 are solved they may also be simultaneously solved for the apparent diffusion coefficients. The memory 108 is further shown as containing an intensity corrected multiple diffusion weighted images 120. These are the multiple diffusion weighted images 112 that have been corrected using the $b_0$ image to correct for gradient non-linearity.

Figure 2:
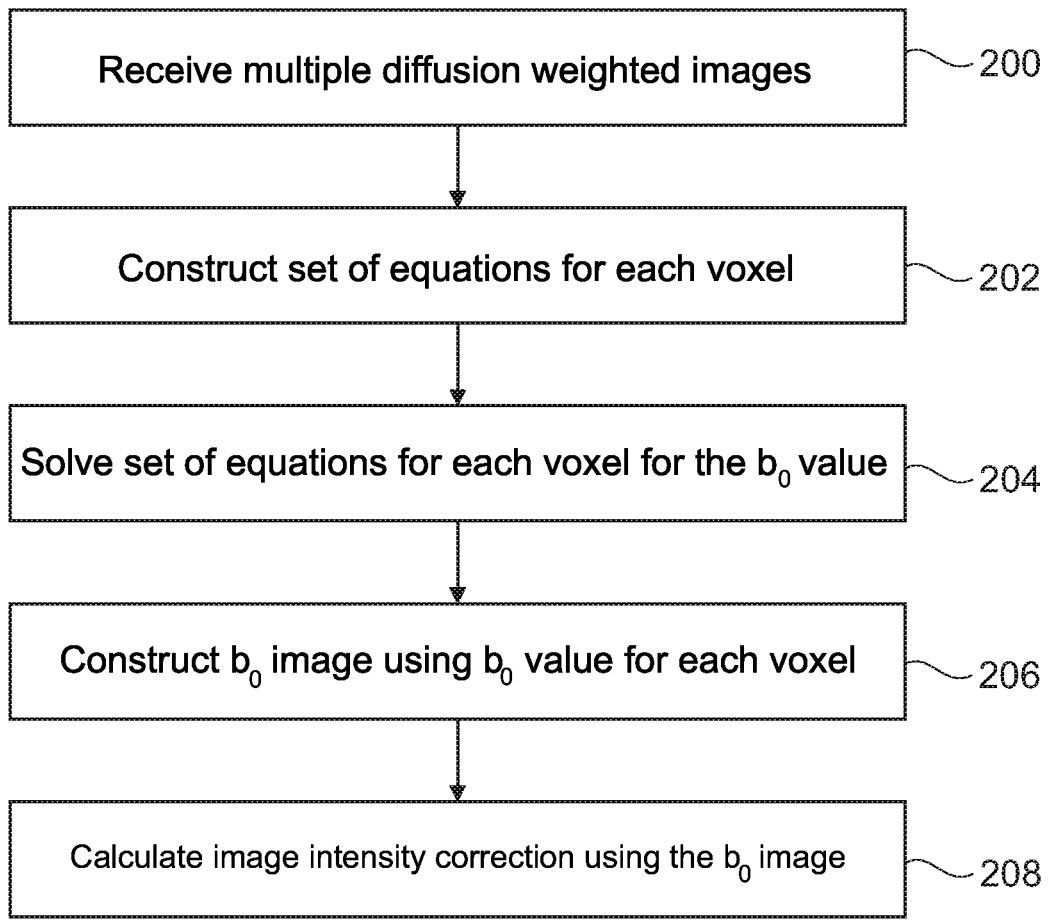
FIG. 2 shows a flow chart which illustrates a method of operating the medical imaging system of FIG. 1.

FIG. 2 shows a flowchart which illustrates a method of operating the medical imaging system 100 of FIG. 1. First in step 200, the multiple diffusion weighted images 112 are received. Each of the multiple diffusion weighted images has an assigned b-value. The multiple diffusion weighted images each have an assigned diffusion weighting direction. For a region of interest there is at least one corresponding voxel in each of the multiple diffusion weighted images. Next in step 202 the set of equations 114 is constructed for each of the at least corresponding voxel.

The set of equations is constructed from an apparent diffusion equation for the assigned diffusion weighting direction for each of the multiple diffusion weighted images. Then, in step 204, the set of equations 114 are solved for each voxel for the b0 value as an optimization. Then, in step 206, the $b_0$ image is constructed using the $b_0$ value for each voxel. In step 208 optionally there is an image intensity correction which is calculated for at least one of the multiple diffusion weighted images 112 using the $b_0$ image 116 to correct for gradient non-linearity. This results in the intensity corrected multiple diffusion weighted images 120.

Figure 3:
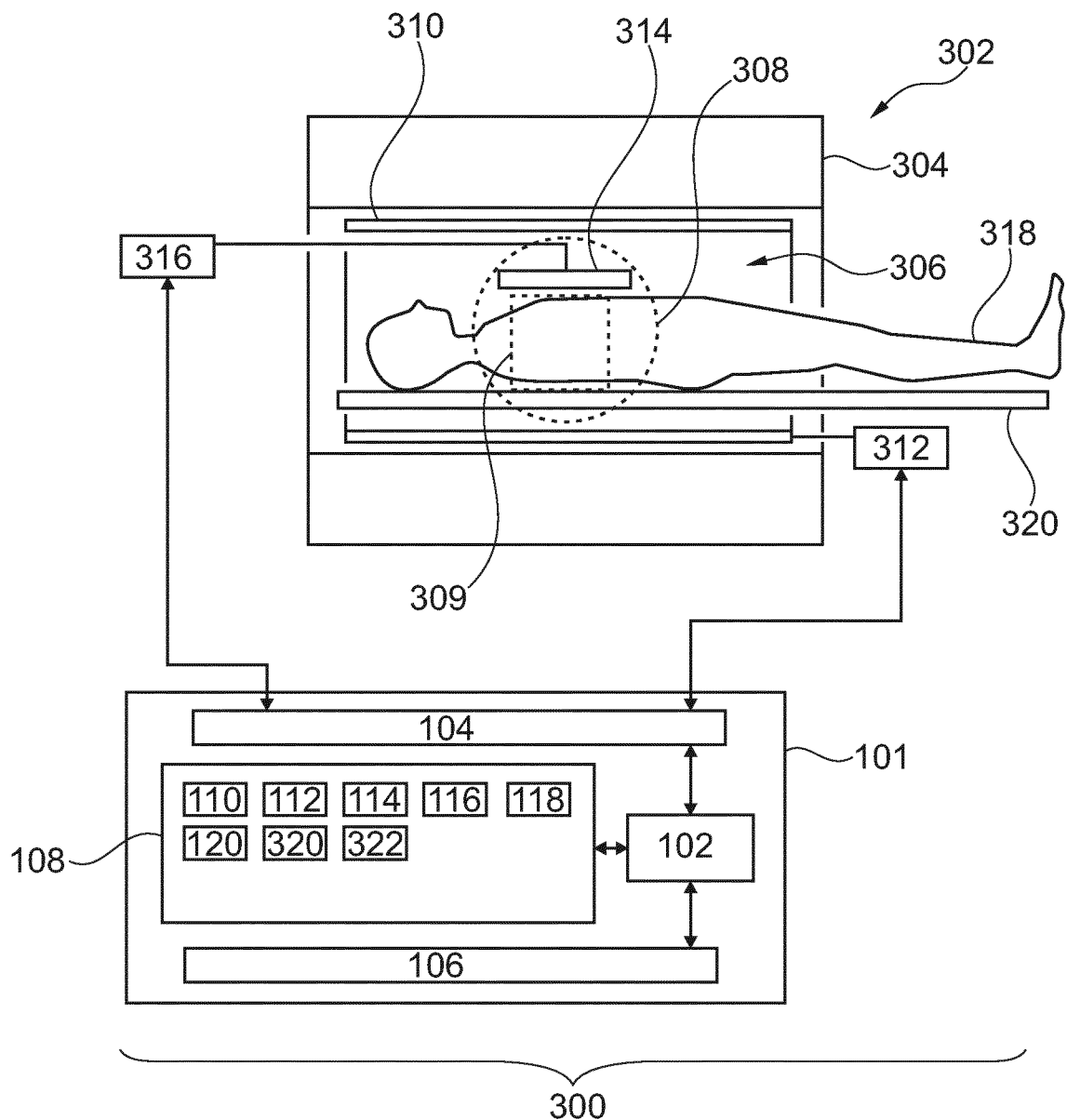
FIG. 3 illustrates a further example of a medical imaging system.

FIG. 3 illustrates a further example of a medical imaging system 300. The medical imaging system 300 in FIG. 3 further comprises a magnetic resonance imaging system 302. The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy.

An open magnet has two magnet sections, one above the other with a space in-between that is large enough to receive a subject: the arrangement of the two sections area similar to that of a Helmholtz coil. Open magnets are popular because the subject is less confined. Inside the cryostat of the cylindrical magnet there is a collection of superconducting coils. Within the bore 306 of the cylindrical magnet 104 there is an imaging zone 108 where the magnetic field is strong and uniform enough to perform magnetic resonance imaging. A region of interest 309 is shown within the imaging zone 308. The magnetic resonance data is typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements. The transceiver 316 and the gradient controller 312 are shown as being connected to the hardware interface 104 of the computer system 101.

The memory 108 is further shown as containing pulse sequence commands 320. The pulse sequence commands 320 are commands or data which can be converted into such commands that control the magnetic resonance imaging system 302 to acquire magnetic resonance imaging data according to a diffusion weighted imaging magnetic resonance imaging protocol. The memory 108 is shown as further containing magnetic resonance imaging data 322 that was acquired by controlling the magnetic resonance imaging system 302 with the pulse sequence commands 320.

Figure 4:
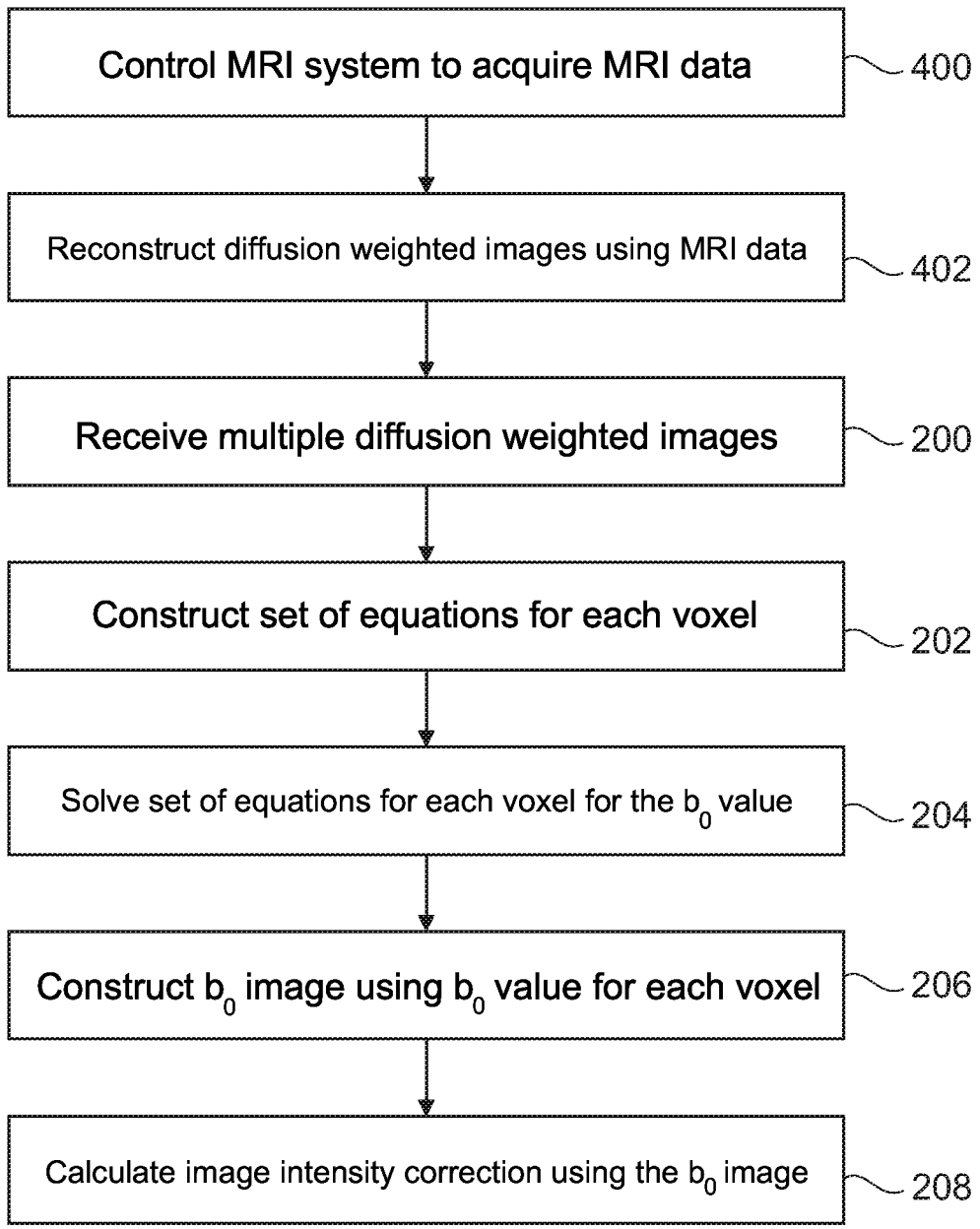
FIG. 4 shows a flow chart which illustrates a method of operating the medical imaging system of FIG. 3.

FIG. 4 shows a flowchart which illustrates a method of operating the medical imaging system 300 of FIG. 3. First in step 400 the magnetic resonance imaging system 302 is controlled with the pulse sequence commands 320 to acquire the magnetic resonance imaging data 322. Next in step 404 the multiple diffusion weighted images 112 are reconstructed from the magnetic resonance imaging data 322. After step 402 the method proceeds to steps 200-208 of the method illustrated in FIG. 2.

Figure 5:
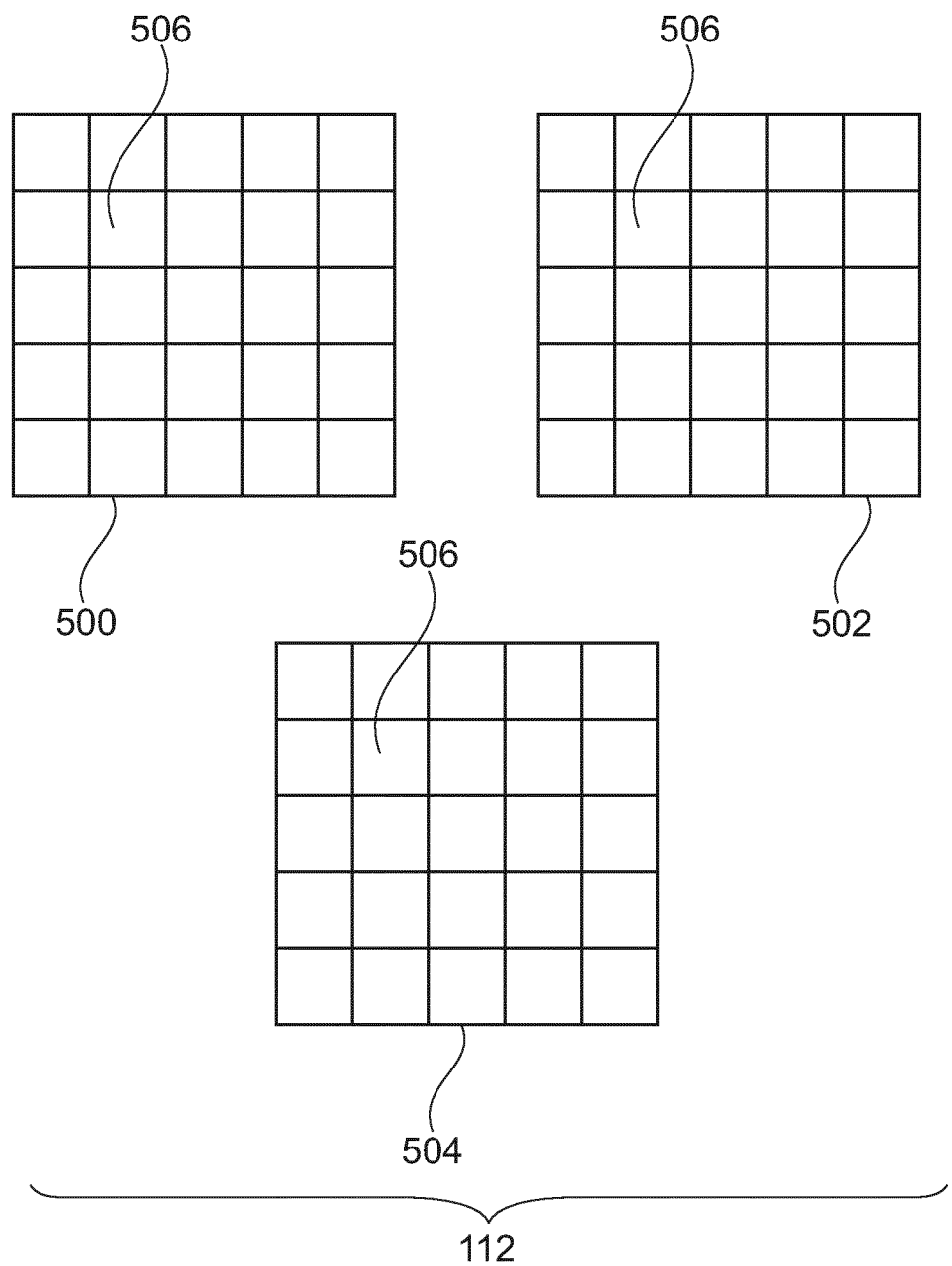
FIG. 5 shows several grids which represent a collection of multiple diffusion weighted images.

FIG. 5 shows several grids which represent a collection of multiple diffusion weighted images 112. In this example three diffusion weighted images 500, 502 and 504 are shown. These images are represented by grids. Each space in the grid represents one voxel. At a same location in each grid there is a voxel labeled 506. The voxel 506 is one of the corresponding voxels for the diffusion weighted images 500, 502 and 504. The set of equations is constructed using the intensity value for the voxel 506. This gives one set of equations which can be solved for $b_0$. This process is then repeated for each of the other voxels in the diffusion weighted images 500, 502, 504.

Examples may provide for an improved Apparent Diffusion Coefficient (ADC) correction by correcting the image intensities of individual DWI images, without requiring an additional $b_0$ Image. Even if an additional $b_0$ image is acquired, a separate $b_0$ can be computed using the where all DWI acquisitions (multiple diffusion weighted images) are included, typically this results in better SNR, less artefacts compared to the measured $b_0$ image.

As mentioned above, in comparison to the Malyarenko paper examples skip the requirement of acquiring a non-diffused $b_0$ image and still be able to correct for gradient non-linearity. This may allow for (somewhat) shorter scan-time and/or more flexibility in scan-protocols.

Another advantage is that a computed $b_0$ estimate typically shows less noise and less artefacts than an acquired $b_0$, potentially resulting in improved image quality of DWI scans where gradient non-linearity correction is applied.

A b0-like image 116 is estimated from a least-squares solution, assuming an exponential decay over the measured b-values, and such $b_0$-like image is used in further calculations for gradient non-linearity corrections.

The Apparent Diffusion Coefficient (ADC) in gradient direction k, for a single pixel, is defined shown in Eq. 1 above.

Malyarenko disclosed a location r dependent correction map $c^k(r)$ to correct the image intensities:

$$S_c(b^k, r) = S(0, r)^{1-\frac{1}{c^k(r)}} \cdot S(b^k, r)^{\frac{1}{c^k(r)}} \quad (3)$$

The $S(0,r)$ value is the $b_0$ value at a particular location r (voxel location). $S_c(b^k,r)$ is the corrected image intensity. $S(b^k,r)$ is the measured image intensity as is in Eq. 1. The location r dependent correction map $c^k(r)$ is a gradient nonlinearity correction.

The correction according to equation (3) requires a $b_0$ image, however when multiple b-values are measured (which is a requirement for an ADC-map derivation), also a $b_0$ can be estimated. Even if a $b_0$ image is acquired, a $b_0$ estimate can be computed from the multiple b-values. Typically, a $b_0$ estimate shows less noise and less artifacts compared to a measured $b_0$. As equation (3) shows the corrected image is a combination of a $b_0$ and a $b_k$ image; thus, improving $b_0$ improves the corrected image.

The $b_0$ is estimated by performing a least-squares mono-exponential fit over the b-values (eq. (1)). As the measured tissue can be anisotropic, and the gradient non-linearity likely varies over the diffusion-directions, an ADC value per diffusion-direction is estimated. For a single pixel the linear equation we will optimize:

$$y = A \cdot x \quad (4)$$

Where vector y contains the natural logarithmic of all measured b-values and b-directions, A is the model matrix containing the b-values, and x is a vector containing the unknowns $b_0$ and ADC values. Eq. (2) above can be used to set up Eq. 4.

For example, Eq. 4 can be re-written as:

$$\ln \begin{pmatrix} S(0) \\ S(b_1^x) \\ S(b_1^y) \\ S(b_1^z) \\ S(b_2^x) \\ S(b_2^y) \\ S(b_2^z) \\ \vdots \end{pmatrix} = \begin{pmatrix} 1 & 0 & 0 & 0 \\ 1 & b_1^x & 0 & 0 \\ 1 & 0 & b_1^y & 0 \\ 1 & 0 & 0 & b_1^z \\ 1 & b_2^x & 0 & 0 \\ 1 & 0 & b_2^y & 0 \\ 1 & 0 & 0 & b_2^z \\ 1 & \vdots & 0 & 0 \\ 1 & 0 & \vdots & 0 \\ 1 & 0 & 0 & \vdots \end{pmatrix} \cdot \begin{pmatrix} b_0 \\ ADC^x \\ ADC^y \\ ADC^z \end{pmatrix}, \quad (5)$$

where the superscripts $b^{x,y,z}$ denote orthogonal diffusion directions (not necessarily aligned with any axis, they can be oblique), and the subscripts $b_{1,2} \ldots$ denote the different b-values (or magnitudes as in (1)).

The first observation in Eq. (5) comes from a $b_0$ acquisition, if a $b_0$ is not acquired that observation can simply be discarded.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
101 computer
102 processor
104 hardware interface
106 user interface
108 memory
110 machine executable instructions
112 multiple diffusion weighted images
114 set of equations
116 b0 image
118 apparent diffusion coefficients
120 intensity corrected multiple diffusion weighted images
200 receive multiple diffusion weighted images of a subject
202 construct a set of equations for each of the at least one corresponding voxel
204 solve the set of equations for each voxel for the b0 value as an optimization
206 construct a b0 image using the b0 value for each voxel
208 calculate an image intensity correction of at least one of the multiple diffusion weighted images using the b0 image to correct for gradient non-linearity
300 medical imaging system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
320 pulse sequence commands
322 magnetic resonance imaging data
400 control the magnetic resonance imaging system to acquire the magnetic resonance imaging data
402 reconstruct the multiple diffusion weighted images using the magnetic resonance imaging data
500 diffusion weighted image
502 diffusion weighted image
504 diffusion weighted image
506 voxel

The invention claimed is:

1. A medical imaging system comprising:
a memory for storing machine executable instructions;
a processor for controlling the medical imaging system, wherein execution of the machine executable instructions causes the processor to:
receive multiple diffusion weighted images of a subject, wherein the multiple diffusion weighted images each have an assigned b-value representing diffusion weighting strength, wherein the multiple diffusion weighted images each have an assigned diffusion weighting direction, wherein for a region of interest there is at least one corresponding voxel in each of the multiple diffusion weighted images;
construct a set of equations for each of the at least one corresponding voxel, wherein the set of equations is constructed from an apparent diffusion equation for the assigned diffusion weighting direction of solve the set of equations for each voxel for a $b_0$-value representing zero diffusion weighting as an optimization;
construct an estimated $b_0$ image using the $b_0$ value for each voxel without an acquired non-diffused $b_0$ image, wherein the $b_0$-value corresponds to image intensity at no diffusion weighting; and
each of the multiple diffusion weighted images; and
calculate an image intensity correction of at least one diffusion weighted images of the multiple diffusion weighted images using the estimated $b_0$ image to provide a corresponding intensity corrected at least one diffusion weighted image; and
a display for displaying the intensity corrected at least one of the multiple diffusion weighted images.

2. A method of medical imaging executed by a processor, the method comprising:
receiving multiple diffusion weighted images of a subject at the processor from a magnetic resonance imaging system, wherein the multiple diffusion weighted images each have an assigned b-value representing diffusion weighting strength, wherein the multiple diffusion weighted images each have an assigned diffusion weighting direction, wherein for a region of interest there is at least one corresponding voxel in each of the multiple diffusion weighted images;
constructing a set of equations for each of the at least one corresponding voxel, wherein the set of equations is constructed from an apparent diffusion equation for the assigned diffusion weighting direction of each of the multiple diffusion weighted images;
solving the set of equations for each voxel for a $b_0$ value representing zero diffusion weighting as an optimization;
constructing an estimated $b_0$ image using the $b_0$ value for each voxel without an acquired non-diffused $b_0$ image, wherein the $b_0$ value corresponds to image intensity at no diffusion weighting;
calculating an image intensity correction of at least one diffusion weighted images of the multiple diffusion weighted images using the estimated $b_0$ image to provide a corresponding intensity corrected at least one diffusion weighted imam; and causing the intensity corrected at least one diffusion weighted image to be displayed for viewing by a user.

3. A non-transitory computer readable medium storing machine executable instructions for execution by a processor controlling a medical imaging system, wherein execution of the machine executable instructions causes the processor to:

receive multiple diffusion weighted images of a subject, wherein the multiple diffusion weighted images each have an assigned b-value representing diffusion weighting strength, wherein the multiple diffusion weighted images each have an assigned diffusion weighting direction, wherein for a region of interest there is at least one corresponding voxel in each of the multiple diffusion weighted images;

construct a set of equations for each of the at least one corresponding voxel, wherein the set of equations is constructed from an apparent diffusion equation for the assigned diffusion weighting direction of each of the multiple diffusion weighted images;

solve the set of equations for each voxel for a $b_0$ value representing zero diffusion weighting as an optimization;

construct an estimated $b_0$ image using the $b_0$ value for each voxel without an acquired non-diffused $b_0$ image, wherein the $b_0$ value corresponds to image intensity at no diffusion weighting;

calculate an image intensity correction of the multiple diffusion weighted images using the estimated $b_0$ image to provide corresponding intensity corrected multiple diffusion weighted images; and cause the intensity corrected multiple diffusion weighted images to be displayed for viewing by a user.

4. The medical imaging system of claim 1, wherein the intensity corrected at least one diffusion weighted image corrects for gradient non-linearity.

5. The medical imaging system of claim 1, wherein the image intensity correction is calculated in each assigned diffusion weighting direction.

6. The medical imaging system of claim 1, further comprising:

a magnetic resonance imaging system, wherein the memory further contains pulse sequence commands configured to control the magnetic resonance imaging system to acquire magnetic resonance imaging data according to a diffusion weighted magnetic resonance imaging protocol, wherein execution of the machine executable instructions further cause the processor to:

control the magnetic resonance imaging system with the pulse sequence commands to acquire the magnetic resonance imaging data; and reconstruct the multiple diffusion weighted images using the magnetic resonance imaging data.

7. The medical imaging system of claim 1, wherein execution of the machine executable instructions further causes the processor to perform a motion correction between the multiple diffusion weighted images before constructing the set of equations.

8. The medical imaging system of claim 1, wherein the multiple diffusion weighted images are EPI multiple diffusion weighted images, wherein execution of the machine executable instructions further causes the processor to perform an EPI distortion correction on the multiple diffusion weighted images before constructing the set of equations.

9. The medical imaging system of claim 1, wherein each of the set of equations is constructed by setting a logarithm of measured intensity of a voxel equal to $b_0$ plus b-value terms times apparent diffusion coefficient terms for each diffusion direction.

10. The medical imaging system of claim 1, wherein the optimization is solved as an exponential fit over b-values in each of the set of equations.

11. The medical imaging system of claim 1, wherein execution of the machine executable instructions further causes the processor to calculate apparent diffusion coefficients for each voxel during solution of the set of equations for each voxel for the $b_0$ value.

12. The medical imaging system of claim 11, wherein execution of the machine executable instructions further causes the processor to calculate corrected apparent diffusion coefficients using the estimated $b_0$ image.

13. The method of claim 2, further comprising correcting for gradient non-linearity based on the intensity corrected at least one diffusion weighted image.

14. The non-transitory computer readable medium of claim 3, wherein the multiple diffusion weighted images of the subject are received from a magnetic resonance imaging system, wherein execution of the machine executable instructions further causes the processor to:

control the magnetic resonance imaging system with pulse sequence commands to acquire magnetic resonance imaging data, wherein the pulse sequence commands are configured to control the magnetic resonance imaging system to acquire magnetic resonance imaging data according to a diffusion weighted magnetic resonance imaging protocol; and reconstruct the multiple diffusion weighted images using the magnetic resonance imaging data.

15. The non-transitory computer readable medium of claim 3, wherein execution of the machine executable instructions further causes the processor to perform a motion correction between the multiple diffusion weighted images before constructing the set of equations.

16. The non-transitory computer readable medium of claim 3, wherein the multiple diffusion weighted images are EPI multiple diffusion weighted images, wherein execution of the machine executable instructions further causes the processor to perform an EPI distortion correction on the multiple diffusion weighted images before constructing the set of equations.

17. The non-transitory computer readable medium of claim 3, wherein each of the set of equations is constructed by setting a logarithm of measured intensity of a voxel equal to $b_0$ plus b-value terms times apparent diffusion coefficient terms for each diffusion direction.

18. The non-transitory computer readable medium of claim 3, wherein the optimization is solved as an exponential fit over b-values in each of the set of equations.

19. The non-transitory computer readable medium of claim 3, wherein execution of the machine executable instructions further causes the processor to calculate apparent diffusion coefficients for each voxel during solution of the set of equations for each voxel for the $b_0$ value.

20. The non-transitory computer readable medium of claim 3, wherein execution of the machine executable instructions further causes the processor to calculate corrected apparent diffusion coefficients using the estimated $b_0$ image.

* * * * *